United States Patent [19]

Stokes et al.

[11] Patent Number: 5,043,791
[45] Date of Patent: Aug. 27, 1991

[54] ELECTRICAL DEVICE HAVING IMPROVED LEAD FRAME AND THERMALLY STABLE CONNECTION ARRANGEMENT AND METHOD

[75] Inventors: Rembert R. Stokes, Inverness; Fred E. Ostrem, Long Grove, both of Ill.

[73] Assignee: Motorola, Inc., Schaumburg, Ill.

[21] Appl. No.: 526,212

[22] Filed: May 18, 1990

Related U.S. Application Data

[63] Continuation-in-part of Ser. No. 402,280, Sep. 5, 1989, and a continuation-in-part of Ser. No. 428,549, Oct. 30, 1989.

[51] Int. Cl.⁵ .......................................... H01L 23/48
[52] U.S. Cl. ...................................... 357/70; 357/72; 357/74; 361/386
[58] Field of Search ................... 357/70, 74; 361/386

[56] References Cited

U.S. PATENT DOCUMENTS 4,849,256  2/1989  Sway-Tin ........................... 361/386
4,878,106 10/1989  Sachs ................................... 357/74

Primary Examiner—Eugene R. LaRoche
Assistant Examiner—R. Ratliff
Attorney, Agent, or Firm—Phillip H. Melamed

[57] ABSTRACT

An electrical component/housing has a main body with a geometric central point and a lead frame having a plurality of leads formed of flat sheet stock. An intermediate flexible planar portion of each lead extends between emerging and end portions of each lead. The intermediate portion is orientated toward the central point so as to maximize absorption of thermal expansion stresses which are radially directed between the central point and the end lead portion which will be bonded to another structure.

Also, a thermally stable connection arrangement comprising: a substrate having an electrical conductor thereon to which a component lead is connected at a third position, the substrate having a first coefficient of thermal expansion ($a_1$); a heat sink base upon which the substrate is located at a first position, the base having a second predetermined coefficient of thermal expansion ($a_2$); and a housing fixed to the base at a second position and having the lead extending therefrom to the electrical conductor to which it is soldered, the lead having a third predetermined coefficient of thermal expansion ($a_3$). A first distance ($l_1$) between the first position and the third position and a second distance ($l_2$) between the first position and the second position being in the ratio $(a_2-a_3)/(a_1-a_3)$ so that there is substantially no differential movement due to thermal expansion between the substrate and the component lead at the third position.

30 Claims, 2 Drawing Sheets

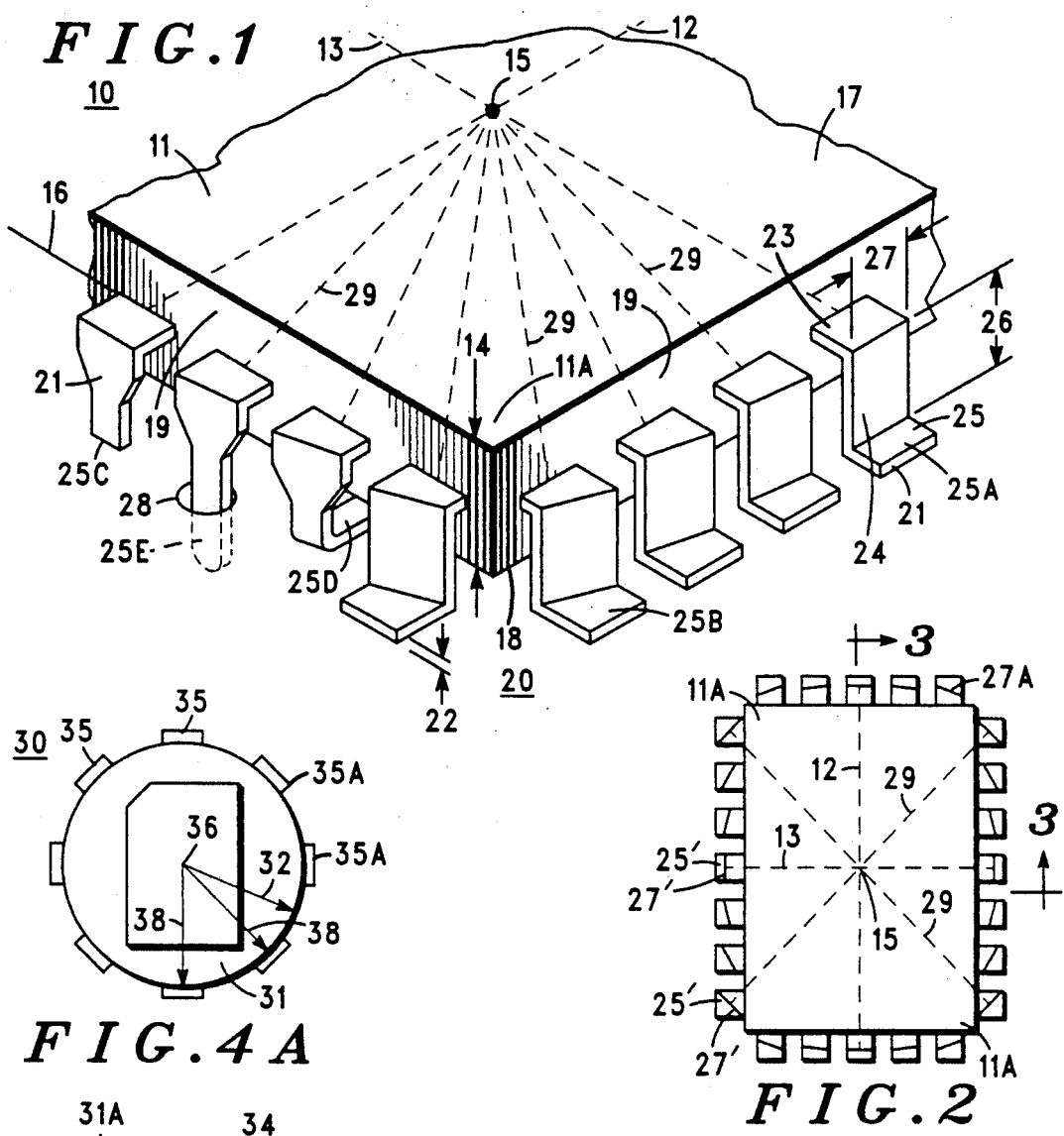
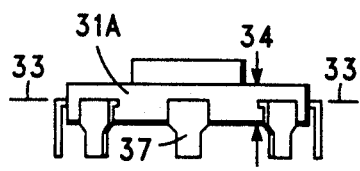
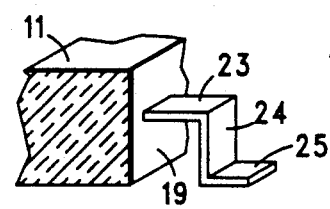
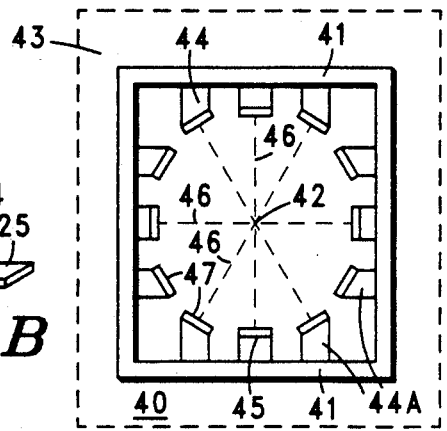

ELECTRICAL DEVICE HAVING IMPROVED LEAD FRAME AND THERMALLY STABLE CONNECTION ARRANGEMENT AND METHOD

This is a continuation-in-part of application Ser. No. 07/402,280, filed Sept. 5, 1989 and Ser. No. 07/428,549, filed Oct. 30, 1989.

BACKGROUND OF THE INVENTION

1. Field of the Invention

The present invention relates to the field of electrical devices, such as electrical components and/or housings for electrical components or electrical assemblies, which have a lead frame bonded to a main body of the electrical device. More particularly, the present invention is directed to such devices wherein the lead frame has a plurality of individual flat electrical leads which extend from insulating well structure of the main body and are intended for connection to other devices/structures.

This invention also relates to thermally stable connection arrangements and particularly, though not exclusively, to such connection arrangements for use in automotive environments.

2. Description of the Prior Art

Some prior electrical components and housings utilize lead frames bonded to insulating wall structure of a main body of the components/housings wherein the lead frame comprises a plurality of individual leads formed from flat sheet stock. An example of such prior structure is the conventional integrated circuit dual in-line package (DIP) in which two separate rows of individual leads extend from opposite insulating sidewalls of a main plastic molded body of the integrated circuit. Typically these leads extend outward and then downward with respect to the integrated circuit main body. End portions of these leads are subsequently bonded to other structures such as a conventional printed circuit board or ceramic circuit board. The leads of DIP lead frame typically comprise a series of parallel planar fingers of the lead frame which initially extend outward from the integrated circuit main body. Planar intermediate portions of the leads extend downward with respect to the main body and terminate in end portions of the leads to be bonded to a circuit board. Similar configurations have been utilized for protective housings for electrical components/assemblies. In such housings, insulating sidewall structures of the housing have inwardly extending leads which have intermediate portions extending downward so as to make connection, via end lead portions, to a circuit board positioned within the sidewalls.

Generally, the planar downwardly extending portion of the above noted individual leads, because it has a relatively thin thickness dimension, is able to absorb some thermal expansion stresses which may be generated between the component/housing and the other structure to which the leads are bonded. However, it has been noted that thermal cycling may cause lead bond failures at the end lead portions, especially for such leads located adjacent to the corners of the main body when the main body has a generally rectangular configuration.

In a known connection arrangement for use in an automotive environment a printed circuit on a substrate is mounted on a heat sink. The printed circuit substrate and heat sink are fixed in a housing. The housing incorporates a lead frame whose leads extend from the exterior to the interior of the housing where they are soldered to the printed circuit. Typically the housing, the printed circuit substrate and the heat sink all have different coefficients of thermal expansion. Thus a soldered connection between the lead frame and the printed circuit is subjected to mechanical stress caused by differential movements between the parts as the temperature changes In the relatively harsh physical conditions of an automotive environment such stresses over the course of hundreds of cycles between temperatures as extreme as $-50°$ C. and $+150°$ C. can often lead to joint failure due to shearing of a soldered joint.

It is known to make the leads longer and thinner in order for them to be more compliant and relieve some of the stress by absorbing some of the differential movement, but such changes often run counter to the requirements of minimizing the size of the arrangement or increasing its ruggedness.

OBJECTS OF THE INVENTION

An object of the present invention is to provide an improved electrical device, such as a component or a housing for an electrical component, having an improved lead frame which is better able to absorb thermal expansion stresses which act on the lead frame leads and/or the bonds of these leads to other structures A more particular object of the present invention is to provide an improved electrical device having an improved lead frame in which intermediate planar portions of the lead frame leads are oriented differently than is normally the case so as to better absorb thermal expansion generated stresses which may act through the leads It is also an object of the present invention to provide a thermally stable connection arrangement and method wherein the above disadvantages of prior connecting arrangements may be overcome or at least alleviated.

BRIEF DESCRIPTION OF THE DRAWINGS

The present invention can be better understood by reference to the drawings in which:

FIG. 1 is a partial perspective view of an electrical component having an improved lead frame in accordance with the present invention;

FIG. 2 is a reduced size top planar view of the component shown in FIG. 1 with some of the leads not illustrated for the purpose of clarity;

FIGS. 3A and 3B comprise alternative partial cross sectional views of the component shown in FIG. 2 taken along lines 3—3;

FIGS. 4A and 4B illustrate a top and side view, respectively, of a generally cylindrical electrical component having a lead frame in accordance with the present invention; and FIG. 5 is a top view of a housing for an electrical component which includes a lead frame in accordance with the present invention.

Figure 6:
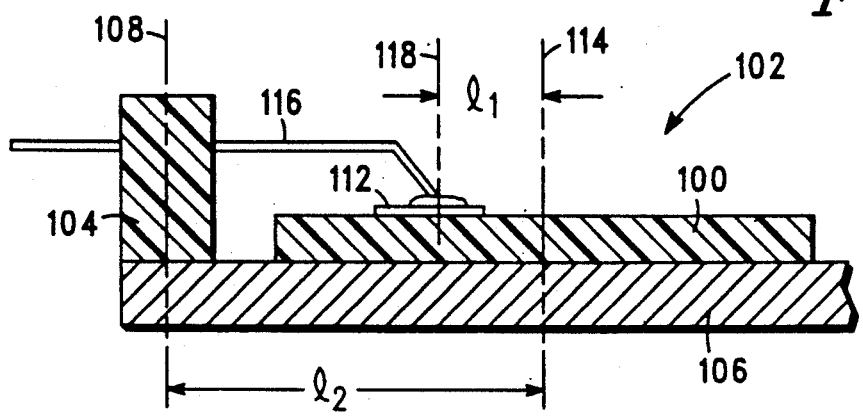
Figure 7:
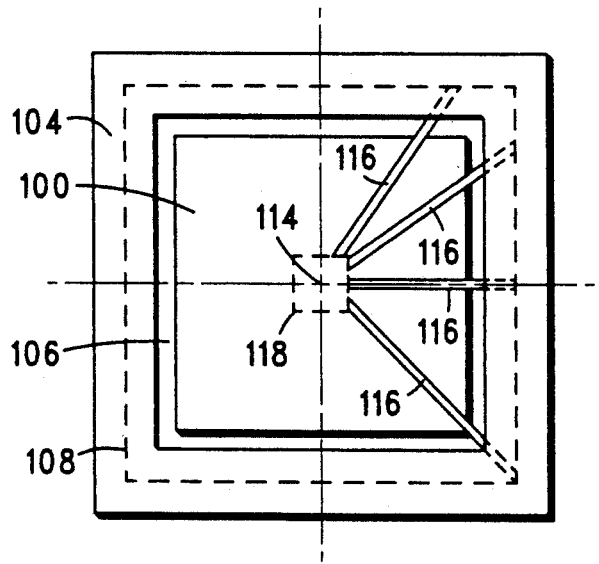
Figure 8:
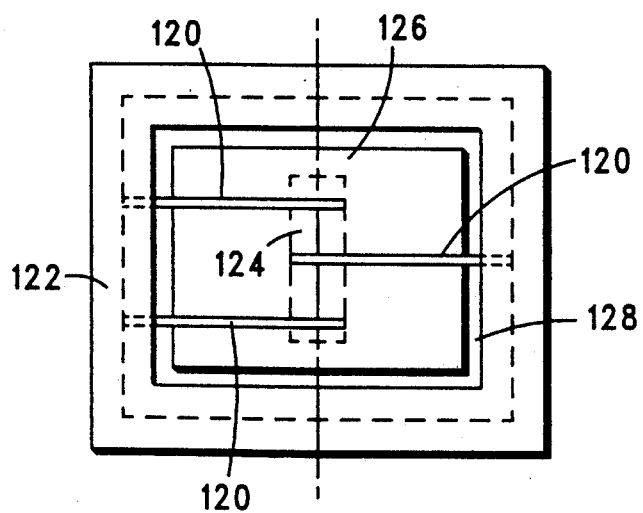

Two thermally stable connection arrangements are shown in FIGS. 6-8, in which:

FIG. 6 shows a cross-sectional elevation through part of a first connection arrangement;

FIG. 7 shows a plan view from above of the connection arrangement of FIG. 1; and FIG. 8 shows a plan view from above of a second connection arrangement.

DESCRIPTION OF THE PREFERRED EMBODIMENTS

Referring to FIG. 1, part of an integrated circuit electrical component 10 is illustrated. The component has a main body 11 generally in the shape of a rectangular parallelepiped having a major axis 12, a minor axis 13 and a thickness dimension 14. The main body 11 has a geometric central point 15 in a horizontal plane 16 associated with the main body 11 such that the axes 12 and 13 are parallel to the horizontal plane and the thickness 14 is perpendicular to the horizontal plane. For the component 10 shown in FIG. 1, this horizontal plane is midway between and parallel to planar top and bottom surfaces 17 and 18 of the main body 11. Preferably the main body 11 is primarily made out of molded plastic and therefore has insulating external sidewalls.

The component 10 includes a lead frame generally referred to by reference numeral 20 which is bonded to insulating external wall portions (sidewalls) 19 of the main body 11 and includes a plurality of at least 5 individual electrical leads 21 positioned about the central point 15. The lead frame 20 and the individual leads 21 are formed of flat sheet stock, having a predetermined thickness 22, which has been punched or etched into a predetermined desired configuration. Each of the leads 21 shown in FIG. 1 has an emerging portion 23 extending outward from insulating portions of the sidewalls 19 of the main body 11 and connected by an intermediate flexible planar portion 24 to an end lead portion 25 to be bonded to another structure. Each of the intermediate portions 24 have orthogonal length and width dimensions 26 and 27, respectively, and a thickness dimension corresponding to the sheet stock thickness 22. The width dimensions 27 of the intermediate portions 24 are measured parallel to the horizontal plane 16 associated with the body 11. Each of the intermediate portions 24 extends along its length dimension 26 between an associated emerging portion 23 and an associated end lead portion 25 in a general direction inclined (nonparallel) with respect to the horizontal plane 16. In FIG. 1, the general inclined direction of the intermediate portion 24 is substantially perpendicular with respect to the horizontal plane 16, and this configuration is generally illustrated by the cross sectional view in FIG. 3A. However, a substantially nonperpendicular orientation (less than 60° with respect to the plane 16) for the intermediate portion 24 is also possible, and this is illustrated in the cross sectional FIG. 3B.

Each of the emerging portions 23 in FIG. 1 comprises a planar portion extending from the sidewalls 19 of the body 11, parallel to the horizontal plane 16, to its associated intermediate lead portion 24. The end portions 25 may have a variety of configurations as is shown in FIG. 1. For example, end portion 25A in FIG. 1 can comprise a rectangular planar portion which extends parallel to the horizontal plane 16. The end portion 25 may also comprise a gull wing type configuration 25B as shown in FIG. 1, also extending parallel to plane 16. Alternatively, the end portion 25 may comprise just an abrupt termination of the intermediate portion 24 so as to form a butt end lead portion 25C. The end portion 25 may also comprise either a J-lead configuration, such as shown as by the end portion 25D, or a narrower extension 25E of the intermediate portion 24 wherein this extension is intended for insertion into a through hole 28 in a printed circuit board. For all of these configurations of the end lead portions 25, the end lead portion 25 is contemplated as being subsequently bonded to an electrical metalization pad on some circuit board (not shown except for hole 28) so as to provide electrical connections between the circuit board and the electrical component 10. In addition, each of the emerging, intermediate and end portions of each the leads 21 together comprise an integral lead which is formed from flat sheet stock wherein the leads 21 together form the lead frame 20 of the present invention.

According to the present invention, each of the intermediate lead portions 24 is oriented toward the central point 15 so as to maximize absorption of thermal stresses by the intermediate portions 24. These stresses to be absorbed are generally radially directed between the central point 15 and each of the end lead portions 25. In prior electrical components which utilized lead frames formed of flat sheet stock, this optimum stress absorption orientation was not achieved, except for at most the 4 centrally located side leads of an integrated circuit wherein these side leads were positioned at the ends of the major and minor axes 12 and 13 which passed through the geometric central point 15. Thus, for leads positioned about the central point 15 and adjacent to each one of 4 different corners 11A of the body 11, the prior art lead frame configuration did not sufficiently provide radial lead compliance so as to absorb thermal stress. The end result was either the fracture of the lead or the fracture of the bond of the lead to another structure due to thermal expansion mismatch between the component and the other structure to which it was bonded. This problem has been overcome by the present invention due to the improved orientation of the intermediate portions 24.

More specifically, FIG. 1 illustrates that each of the intermediate lead portions 24 is oriented such that, for a vertical projection of the leads 21 onto the horizontal plane 16, the projection 27' of the width dimension 27 of portion 24 is substantially perpendicular to radial lines 29, in the horizontal plane, which are drawn from the geometric central point 15 towards the projection 25', in the horizontal plane, of the end lead portion 25 connected to the intermediate portion 24. This configuration differs from prior art configurations in which only at most 4 centrally located leads had this desired configuration, but wherein leads adjacent to the corners 11A of the body 11 did not have this configuration and were therefore unable to minimize the stresses which acted on these leads and/or the bonds of these leads to other structures.

Essentially, the change in orientation of the intermediate portions 24 described above has resulted in the leads 21 being able to more readily absorb thermal expansion mismatch generated stresses. This minimizes the effect of these stresses with regard to rupturing of structures. This may be viewed as changing the orientation of the intermediate lead portion 24 such that it forms a flexible, radially compliant member to absorb stress transmitted in the direction between the central point 15 and the end portion 25 which is to be bonded to other structures.

While FIGS. 1, 2, 3A and 3B illustrate utilization of the present invention in connection with an electrical component having a generally rectangular shaped main body, FIGS. 4A and 4B illustrate how the same general principles can be applied to an electrical component 30 having a molded plastic main body 31 which has a generally cylindrical shape. The main body 31 has a radial dimension 32 parallel to an associated horizontal plane 33, a thickness dimension 34 perpendicular to this horizontal plane and an insulating cylindrical sidewall 31A. In FIGS. 4A and 4B a plurality of leads 35 of a lead frame 35A are formed from flat sheet stock and are disposed about a geometric central point 36 in the plane 33. The leads 35 directly correspond to the leads 21 shown in the preceding FIGS. 1-3 and extend between emerging and end lead portions. Each of the leads 21 and 35 have intermediate portions 24 and 37, respectively, properly oriented with respect to the central points 15 and 36 so as to generated when the leads are bonded to other structures. In FIG. 4A these stresses are directed along radial lines 38.

Referring to FIG. 5, a top view of an electrical component housing 40 is illustrated in which the housing includes a lead frame in accordance with the present invention. More specifically, the housing includes 4 molded plastic insulating sidewalls 41 which form a generally rectangular main body of the housing. The sidewalls 41 surround a central geometric point 42 of the housing that is located in a horizontal plane 43 associated with the housing and perpendicular to the sidewalls 41. The horizontal plane 43 in FIG. 5 is essentially parallel to the plane view shown in FIG. 5. The housing 40 includes a plurality of individual lead frame leads 44 which form a lead frame 44A. The leads 44 are formed of flat sheet stock and directly correspond to the leads 21 shown in FIG. 1. Each of the leads 21 and 44 have flexible planar intermediate portions, 24 and 45, oriented with respect to an associated geometric central point (15, 42) so as to provide a radially compliant lead frame for the component 10 and housing 40. For the lead frame 44A, stresses that are radially directed along lines 46 between the central point 42 and end lead portions 47 of the leads 44, which end portions are to be bonded to other structures such as a printed or ceramic circuit board, will be absorbed by the flexible planar intermediate portions 45 of the leads 44.

Referring now to FIG. 6, a first sensor module 102 for use in an automobile (not shown) includes a circuit 112 printed on a heat-conducting ceramic substrate 100, e.g. made from aluminum oxide $Al_2O_3$. The printed circuit substrate 100 is mounted (by double-sided adhesive tape, not shown, by a compliant adhesive layer, not shown, or by a non-compliant adhesive, not shown, applied at its center) with its center at a position 114 on a heat sink base 106. The heat sink base 106 is fixed by pins (not shown) to the wall of a plastic housing 104 at a position 108. The housing 104 is insert molded with a lead frame having leads 116 extended through its walls from the exterior to the interior of the housing In the interior of the housing the leads 116 are soldered to the printed circuit at a position 118 as shown in FIG. 6.

The positions 108, 114 and 118 define a length $l_1$ between the positions 114 and 118 and a length $l_2$ between the positions 108 and 114. The positions 108, 14 and 118 are carefully chosen so that the lengths $l_1$ and $l_2$ are in a desired relationship, as will be more fully explained below.

The substrate 100 has a coefficient of thermal expansion $a_1$, the heat sink base 106 has a coefficient of thermal expansion $a_2$, and the leads 116 have a coefficient of thermal expansion $a_3$. The material of the housing 104 is chosen so as to have substantially the same coefficient of thermal expansion $a_2$ as the heat sink base 106.

In use of the sensor module 102 in an automobile, the module will typically be subjected to varying temperatures which may range between the extremes of $-50°$ C. and $+150°$ C. As the temperature changes, the different parts of the sensor having different coefficients of thermal expansion will move relative to each other.

The substrate 100 expands from its center in all directions. Thus, the length $l_1$ from the substrate center 14 to the lead frame connection point 118 expands by an amount $\Delta l_1$, which is given by the relation $$\Delta l_1 = a_1 . l_1 . \Delta T_1 \qquad (1)$$

where $\Delta T_1$ is the change in temperature.

The heat sink base 106 expands in the same direction by an amount $\Delta l_2$, which is given by the relation $$\Delta l_2 = a_2 . l_2 . \Delta T_2 \qquad (2)$$

where $\Delta T_2$ is the change in temperature.

However, the lead 116, being constrained relative to the heat sink base 106 to the left of position 114 as seen in FIG. 6, expands in the opposite direction to the substrate 100 and the heat sink base 106 by an amount $\Delta l_3$, which is given by the relation $$\Delta l_3 = a_3 . (l_2 - l_1) . \Delta T_3 \qquad (3)$$

where $\Delta T_3$ is the change in temperature.

In order to eliminate shear stress at the soldered connection point 118, there must be no relative movement between the connected end of the lead 116 and the substrate 100. This condition will be met if the following relationship is satisfied $$\Delta l_1 = \Delta l_2 - l_3 \qquad (4)$$

It may be assumed that all parts of the connection arrangement shown in FIG. 6 are at the same temperature, in which case $$\Delta T_1 = \Delta T_2 = \Delta T_3 \qquad (5)$$

Substituting relationships (1), (2), (3) and (5) into relationship (4) gives the relationship $$a_1 . l_1 = a_2 . l_2 - a_3 . (l_2 - l_1).$$

which may be reduced to $$l_1 = l_2 . (a_2 - a_3) / (a_1 - a_3). \qquad (6)$$

Thus, by choosing the positions 108, 114 and 118 in the arrangement shown in FIG. 6 with respect to the coefficients of thermal expansion a1, a2 and a3 so that the lengths $l_1$ and $l_2$ satisfy the relationship (6), differential thermal expansion at the soldered connection point 118 is eliminated and shear stress at the point is removed, obviating a significant cause of joint failure.

Since the arrangement will, as will be appreciated, expand (or contract) equally both across the width of the figure and perpendicular to the plane of the figure, differential thermal expansion at the soldered connection point 118 is eliminated in both of these directions by satisfying the above relationship (6) in both of these directions and by arranging the lead 116 so that its center line passes through the center of the housing 104 (as may be seen in FIG. 7).

Referring now also to FIG. 7, when the three coefficients of thermal expansion $a_1$, $a_2$ and $a_3$ satisfy the relationship $$a_3 > a_2 > a_1.$$

a plurality of leads 116 from the housing 104 can be arranged to have no differential thermal expansion at their soldered connections to the printed circuit conductor on the substrate 100 by choosing the lengths of the leads so as to satisfy the above relationship (6) and by configuring the leads to extend radially from the center of the housing 104, since the arrangement will, as mentioned above, expand (or contract) equally in both orthogonal directions in the plane of FIG. 7.

Referring now to FIG. 8, in an alternative embodiment where the three coefficients of thermal expansion $a_1$, $a_2$ and $a_3$ satisfy the relationship $$a_2 > a_3 > a_1,$$

the ratio $(a_2 - a_3)/(a_1 - a_3)$ is negative, and so the length $l_2$ must be negative (i.e. must extend in the opposite direction) with respect to the length $l_1$ for the above relationship (6) to be satisfied.

This is achieved in the embodiment shown in FIG. 8 by configuring connection leads 120 to extend from opposite sides of a housing 122 to respectively remote sides of a printed circuit 124 to which they are soldered. The leads 120 extend across the printed circuit 124 and are interdigitated. Similarly to the previously described embodiment, the printed circuit 124 is printed on a heat conducting ceramic substrate 126, and both the substrate and the housing are fixed to a heat sink base 128. It will be appreciated that this configuration allows the above relationship (6) to be satisfied for each lead in respect a single direction only, since the interdigitation of the leads 120 is not fully compatible with the radial arrangement of the leads 116 as shown in FIG. 7.

It will be appreciated that the above described invention allows differential thermal expansion at the connection point between a lead and an adjacent conductor to be obviated (or alleviated in the case of the embodiment of FIG. 8), removing or reducing the constraints on the rigidity of the lead and allowing the lead to be made more rugged.

While we have shown and described specific embodiments of this invention, further modifications and improvements will occur to those skilled in the art. All such modifications which retain the basic underlying principles disclosed and claimed herein are within the scope of this invention.

We claim:

1. An electrical device (component/housing) having an improved lead frame, comprising:
    an electrical device comprising a main body having an associated horizontal plane, a geometric central point in the plane, and insulating wall portions; and
    a lead frame bonded to said insulating wall portions of the body and comprising a plurality of at least 5 electrical leads generally positioned about said central point and formed of flat sheet stock having a predetermined thickness, each of said leads having an emerging portion extending from said insulating wall portions of said body and connected by an intermediate flexible portion to an end lead portion to be bonded to another structure, said intermediate portion having orthogonal length and width dimensions and a thickness corresponding to said sheet stock thickness, said width dimension being measured parallel to said horizontal plane, said intermediate portion extending along its length dimension between said emerging and end lead portions in a general direction inclined with respect to said horizontal plane,
    wherein the improvement comprises each of said intermediate lead portions being oriented toward said central point so as to maximize absorption of stresses, by said intermediate portion, which stresses are radially directed between said central point and said end lead portion.

2. An electrical device according to claim 1 wherein each of said intermediate portions extend substantially perpendicular with respect to said horizontal plane.

3. An electrical device according to claim 2 wherein each of said end portions of said leads includes a planar portion extending parallel to said horizontal plane.

4. An electrical device according to claim 3 wherein said main body has a generally rectangular shape with major and minor axes parallel to said horizontal plane and a thickness dimension perpendicular to said horizontal plane and wherein at least one of said leads is position adjacent a corner of said body.

5. An electrical device according to claim 1 wherein said main body is a molded plastic body.

6. An electrical device (component/housing) having an improved lead frame, comprising:
    an electrical device comprising a main body having an associated horizontal plane, a geometric central point in the plane, and insulating wall portions; and
    a lead frame bonded to said insulating wall portions of said body and comprising a plurality of at least 5 electrical leads generally positioned about said central point and formed of flat sheet stock having a predetermined thickness, each of said leads having an emerging portion extending from said insulating wall portions of said body and connected by an intermediate flexible planar portion to an end lead portion to be bonded to another structure, said intermediate portion having orthogonal length and width dimensions and a thickness corresponding to said sheet stock thickness, said width dimension being measured parallel to said horizontal plane, said intermediate portion extending along its length dimension between said emerging and end lead portions in a direction inclined with respect to said horizontal plane,
    wherein the improvement comprises each of said intermediate lead portions being oriented such that for a vertical projection of said lead onto said horizontal plane, said width dimension of said intermediate portion is substantially perpendicular to a radial line in said horizontal plane drawn from said geometric central point toward the projection, in said horizontal plane, of said end lead portion connected to said intermediate portion, whereby after the leads are bonded to another structure, thermal expansion stresses which may act on the leads and/or the bonds of the leads to the other structure are minimized due to the orientation of the intermediate lead portions 7. An electrical device according to claim 6 wherein each of said emerging portions comprises a planar portion extending from said body, parallel to said horizontal plane, to said intermediate lead portion.

8. An electrical device according to claim 7 wherein each of said intermediate portions extend substantially perpendicular with respect to said horizontal plane.

9. An electrical device according to claim 8 wherein each of said end portions of said leads includes a planar portion extending parallel to said horizontal plane.

10. An electrical device according to claim 6 wherein said emerging, intermediate and end portions of each of said leads comprise an integral lead formed from flat sheet stock.

11. An electrical device according to claim 10 wherein said main body has a generally rectangular shape with major and minor axes parallel to said horizontal plane and a thickness dimension perpendicular to said horizontal plane.

12. An electrical device according to claim 11 wherein at least one of said leads has its emerging portion adjacent a corner of said main body.

13. An electrical device according to claim 10 wherein said main body has a generally cylindrical shape with a radial dimension parallel to said horizontal plane and a thickness dimension perpendicular to said horizontal plane.

14. An electrical device according to claim 6 wherein said main body comprises an electrical device housing having insulating sidewalls perpendicular to said horizontal plane and surrounding said central geometric point and said leads extend generally inward from said sidewalls.

15. An electrical device according to claim 6 wherein said main body is a molded plastic body.

16. An electrical device (component/housing) having an improved lead frame, comprising:
   an electrical device comprising a main body having a generally rectangular parallelepiped configuration, an associated horizontal plane and having a geometric central point in the plane, and insulating wall portions; and
   a lead frame bonded to said insulating wall portions of said body and comprising at least one electrical lead positioned adjacent each one of four different corners of said body about said central point, each of said leads formed of flat sheet stock having a predetermined thickness, each of said leads having an emerging portion extending from said insulating wall portions of said body and connected by an intermediate flexible planar portion to an end lead portion to be bonded to another structure, said intermediate portion having orthogonal length and width dimensions and a thickness corresponding to said sheet stock thickness, said width dimension being measured parallel to said horizontal plane, said intermediate portion extending along its length dimension between said emerging and end lead portions in a direction inclined with respect to said horizontal plane,
   wherein the improvement comprises each of said intermediate lead portions being oriented such that for a vertical projection of said lead onto said horizontal plane, said width dimension of said intermediate portion is substantially perpendicular to a radial line in said horizontal plane drawn from said geometric central point toward the projection, in said horizontal plane, of said end lead portion connected to said intermediate portion, whereby after the leads are bonded to another structure, thermal expansion stresses which may act on the leads and/or the bonds of these leads to the other structure are minimized due to the orientation of the intermediate lead portions.

17. An electrical device according to claim 16 wherein said emerging, intermediate and end portions of each of said leads comprise an integral lead formed from flat sheet stock.

18. An electrical device according to claim 17 wherein each of said emerging portions comprises a planar portion extending from said insulating wall portions of said body, parallel to said horizontal plane, to said intermediately portion.

19. An electrical device according to claim 18 wherein each of said intermediate portions extend substantially perpendicular with respect to said horizontal plane.

20. An electrical device according to claim 19 wherein each of said end portions of said leads includes a planar portion extending parallel to said horizontal plane.

21. A thermally stable connection arrangement comprising:
   a substrate having an electrical conductor thereon, the substrate having a first predetermined coefficient of thermal expansion;
   a base upon which the substrate is located at a first position, the base having a second predetermined coefficient of thermal expansion; and
   a housing fixed to the base at a second position, the housing having at least one lead extending therefrom to the electrical conductor to which it is connected at a third position, and the lead having a third predetermined coefficient of thermal expansion,
   a first distance between the first position and the third position and a second distance between the first position and the second position being in a ratio substantially equal to the ratio of the difference between the second and third predetermined coefficients of thermal expansion and the difference between the first and third predetermined coefficients of thermal expansion, whereby there is substantially no differential movement due to thermal expansion between the substrate and the lead at the third position.

22. A thermally stable connection arrangement according to claim 21 comprising a plurality of leads arranged radially with respect to the center of the housing.

23. A thermally stable connection arrangement according to claim 21 comprising a plurality of leads interdigitated and extending across the housing from remote sides thereof to the electrical conductor.

24. A thermally stable connection arrangement according to claim 21 wherein the base comprises a heat sink.

25. A thermally stable connection arrangement according to claim 21 wherein the substrate comprises a heat conducting ceramic.

26. A thermally stable connection arrangement according to claim 21 wherein the ceramic comprises aluminum oxide.

27. A thermally stable connection arrangement according to claim 21 wherein the connection between the lead and the electrical conductor on the substrate is soldered.

28. A thermally stable connection arrangement according to claim 21 wherein the lead extends through the housing.

29. A thermally stable connection arrangement according to claim 21 wherein the housing comprises a plastic molding.

30. A thermally stable connection arrangement according to claim 29 wherein the lead is embedded in the housing.

* * * * *